United States Patent
Fukunaga

(10) Patent No.: US 6,784,527 B2
(45) Date of Patent: Aug. 31, 2004

(54) ELECTRONIC CARD FORMED OF A DOUBLE-SIDED PRINTED CIRCUIT BOARD WITH STATIC ELECTRICITY PREVENTION CIRCUIT

(75) Inventor: Minoru Fukunaga, Ome (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 10/252,798

(22) Filed: Sep. 24, 2002

(65) Prior Publication Data

US 2003/0141580 A1 Jul. 31, 2003

(30) Foreign Application Priority Data

Sep. 28, 2001 (JP) ........................................ 2001-304575

(51) Int. Cl.[7] .............................................. H01L 23/02
(52) U.S. Cl. ....................... 257/679; 257/678; 257/687; 361/736; 361/737
(58) Field of Search ................................ 257/678, 679, 257/680, 700, 798, 750, 756, 758, 687, 681, 724, 787; 438/106, 121; 361/736, 737

(56) References Cited

U.S. PATENT DOCUMENTS

| | | | | |
|---|---|---|---|---|
| 6,137,168 A | * | 10/2000 | Kirkman | |
| 6,150,193 A | * | 11/2000 | Glenn | |
| 6,462,273 B1 | * | 10/2002 | Corisis et al. | 174/52.2 |
| 6,477,046 B1 | * | 11/2002 | Stearns et al. | |
| 2001/0023982 A1 | * | 9/2001 | Wallace | 257/679 |

* cited by examiner

Primary Examiner—Long Pham
Assistant Examiner—Dilinh Nguyen
(74) Attorney, Agent, or Firm—Finnegan, Henderson, Farabow, Garrett & Dunner, L.L.P.

(57) ABSTRACT

Charge prevention patterns disposed on one surface of a circuit board and electrolytic plating patterns disposed on the other surface of the circuit board are disposed in a zigzag pattern in end surfaces of the substrate. The thickness of a coating layer is smaller than the thickness of a card case.

21 Claims, 4 Drawing Sheets

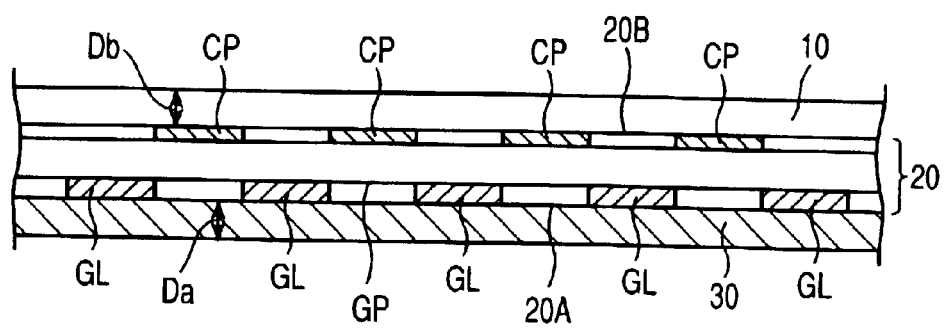
F I G. 4

ELECTRONIC CARD FORMED OF A DOUBLE-SIDED PRINTED CIRCUIT BOARD WITH STATIC ELECTRICITY PREVENTION CIRCUIT

CROSS-REFERENCE TO RELATED APPLICATIONS

This application is based upon and claims the benefit of priority from the prior Japanese Patent Application No. 2001-304575, filed Sep. 28, 2001, the entire contents of which are incorporated herein by reference.

BACKGROUND OF THE INVENTION

1. Field of the Invention

The present invention relates to electronic cards formed of a double-sided printed circuit board.

2. Description of the Related Art

Electronic cards, such as an SD (Secure Digital) card which is formed of a non-volatile semiconductor memory device and which constitutes, for example, a small-sized memory card is inserted into and removed from an electronic equipment by gripping it. Thus, measures must be taken to prevent static electricity from being generated.

Small-sized memory cards like the above, must be thin. In order to realize a very thin card, therefore, card surfaces may be formed by covering only a component mounted surface formed on one surface of a printed circuit board, with a card case, and coating a wiring pattern portion on the other surface with a protective film composed of, for example, ultraviolet hardened resin. More effective electrostatic prevention measures are required for such small-sized very thin electronic cards.

Further, to aid the manufacture of electronic cards, electrolytic plating patterns required for gold plating or the like in a desired circuit pattern are continuously disposed over a plurality of circuit boards before the individual circuit boards are blanked. After the individual circuit boards have been obtained, the patterns remain at the edges of the circuit boards. These electrolytic plating patterns remain connected to circuit patterns forming internal signal paths. Thus, when a discharge current induced by static electricity flows into the patterns formed at the edges of the circuit board, it may destroy the internal circuit or data or result in other problems. Thus, effective electrostatic measures have been required particularly for the patterns formed at that edge of the circuit board which is located closer to the grip portion.

As described above, more effective electrostatic prevention measures are conventionally required for electronic cards such as a small-sized memory card. In particular, effective electrostatic measures are conventionally required for the patterns formed at that edge of the circuit board which is located closer to the gripped portion.

BRIEF SUMMARY OF THE INVENTION

An embodiment of the present invention is directed to an electronic card that substantially obviates one or more of the problems due to limitations and disadvantages of the related art.

According to an embodiment of the present invention, an electronic card comprises:

a printed circuit board which has components mounted on one surface thereof;

a cover member which covers the one surface of the printed circuit board;

external connection terminals provided on the other surface of the printed circuit board;

charge prevention circuit patters provided on the other surface of the printed circuit board; and a film which coats the other surface of the printed circuit board except for the external connection terminals.

Additional objects and advantages of the present invention will be set forth in the description which follows, and in part will be obvious from the description, or may be learned by practice of the present invention.

The objects and advantages of the present invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the present invention and, together with the general description given above and the detailed description of the embodiments given below, serve to explain the principles of the present invention in which:

FIG. 4 is a diagram showing an example of circuit patterns at an end of the circuit board according to the embodiment.

DETAILED DESCRIPTION OF THE INVENTION

An embodiment of an electronic card according to the present invention will be described with reference to the drawings. In this embodiment, an SD card will be described as an electronic card to which the present invention is applied.

Figure 1A:
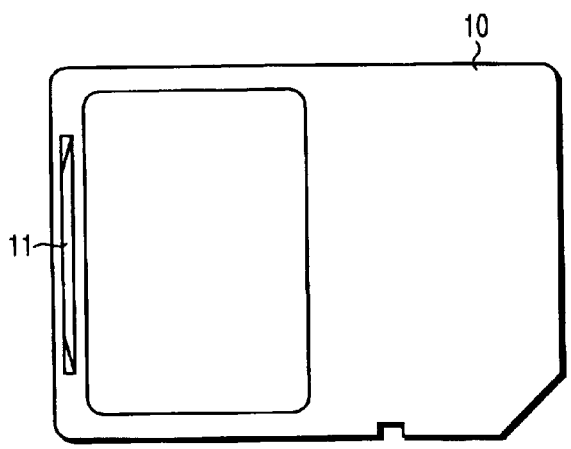
FIG. 1A is a plan view of a front side of an electronic card according to an embodiment of the present invention.
Figure 1B:
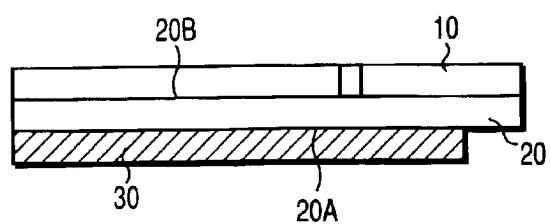
FIG. 1B is a sectional view of the electronic card shown in FIG. 1A.
Figure 1C:
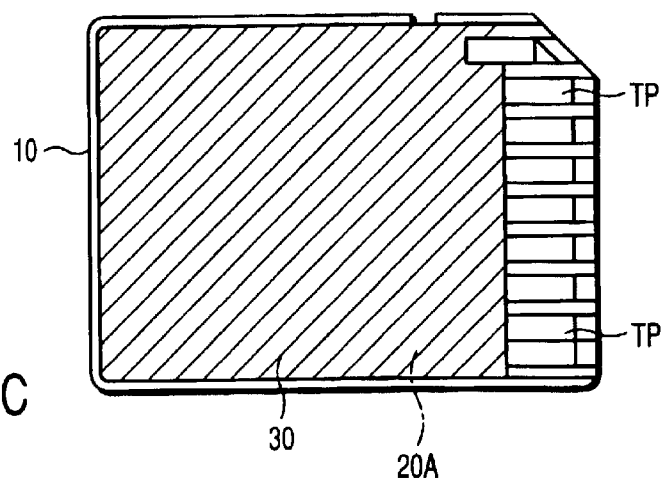
FIG. 1C is a plan view of a back side of the electronic card shown in FIG. 1A.

FIGS. 1A to 4 show a first embodiment in which the present invention is applied to an SD card. In the SD card, a circuit component mounted surface 20B (hereinafter referred to as a "front surface") of a very thin double-sided printed circuit board (hereinafter simply referred to as a "circuit board") is entirely covered with a card case 10 to protect internal circuit components, as shown in FIG. 1B. The card case 10 is composed of a flat and rectangular synthetic resin material and has a grip portion 11 formed at one end thereof and formed of a recessed groove, as shown in FIG. 1A. The circuit board 20 has a plurality of contact terminals TP, TP, . . . disposed on the opposite surface (hereinafter referred to as a "back surface") of the circuit board 20 at one side thereof located opposite the grip portion 11 as shown in FIG. 1C. The contact terminals TP, TP, . . . are exposed, with the rest of the back surface 20A coated flat with a protective film composed of, for example, ultraviolet hardened resin or the like. This coating layer 30 forms a card surface.

Figure 2:
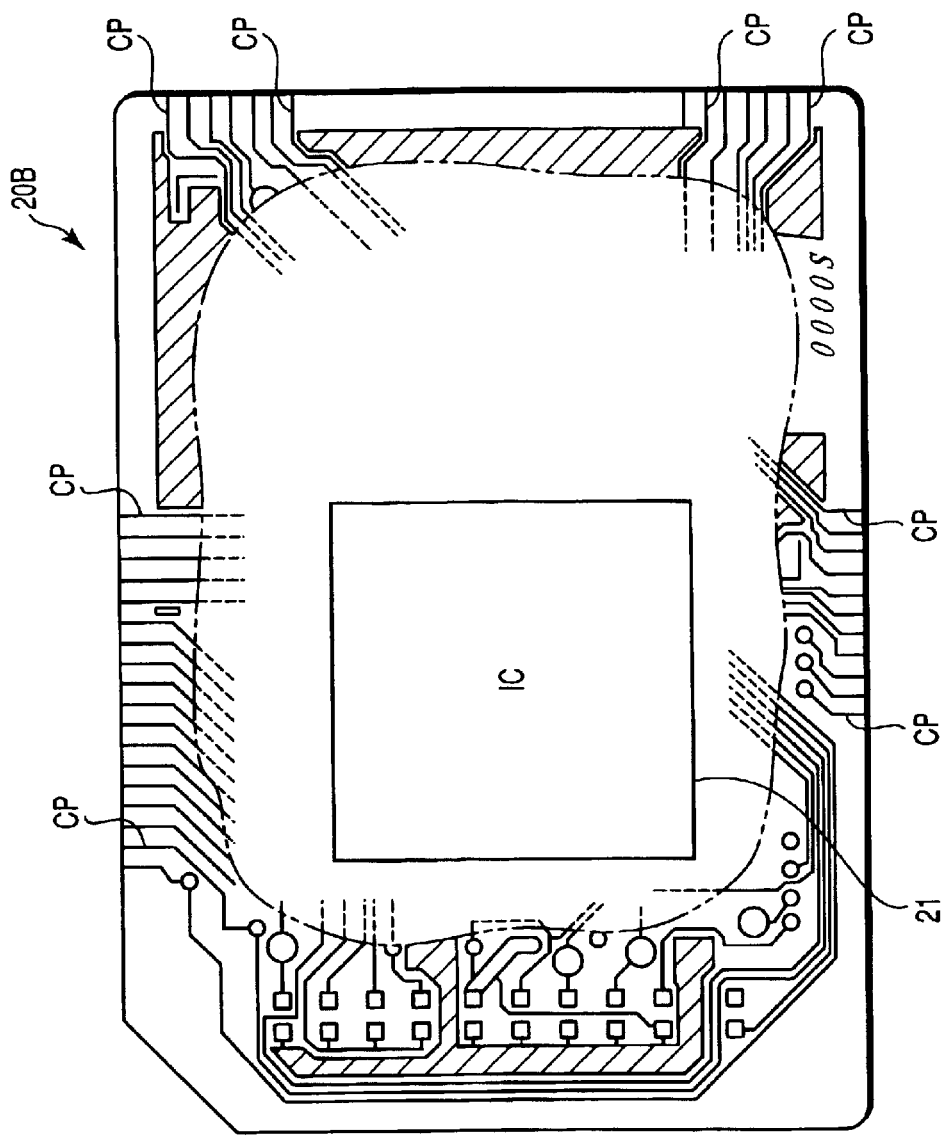
FIG. 2 is a diagram showing circuit patterns on a front surface of a circuit board according to the embodiment.

FIG. 2 shows the details of the front surface 20B of the circuit board 20. Circuit component mounting patterns and circuit patterns forming signal paths are disposed on the front surface 20B. A circuit component 21 is soldered onto the circuit component mounting patterns by reflow. Furthermore, a plurality of electrolytic plating patterns CP, CP, . . . connected to the circuit patterns forming the signal paths are disposed so as to extend from end surfaces of the circuit board.

Figure 3:
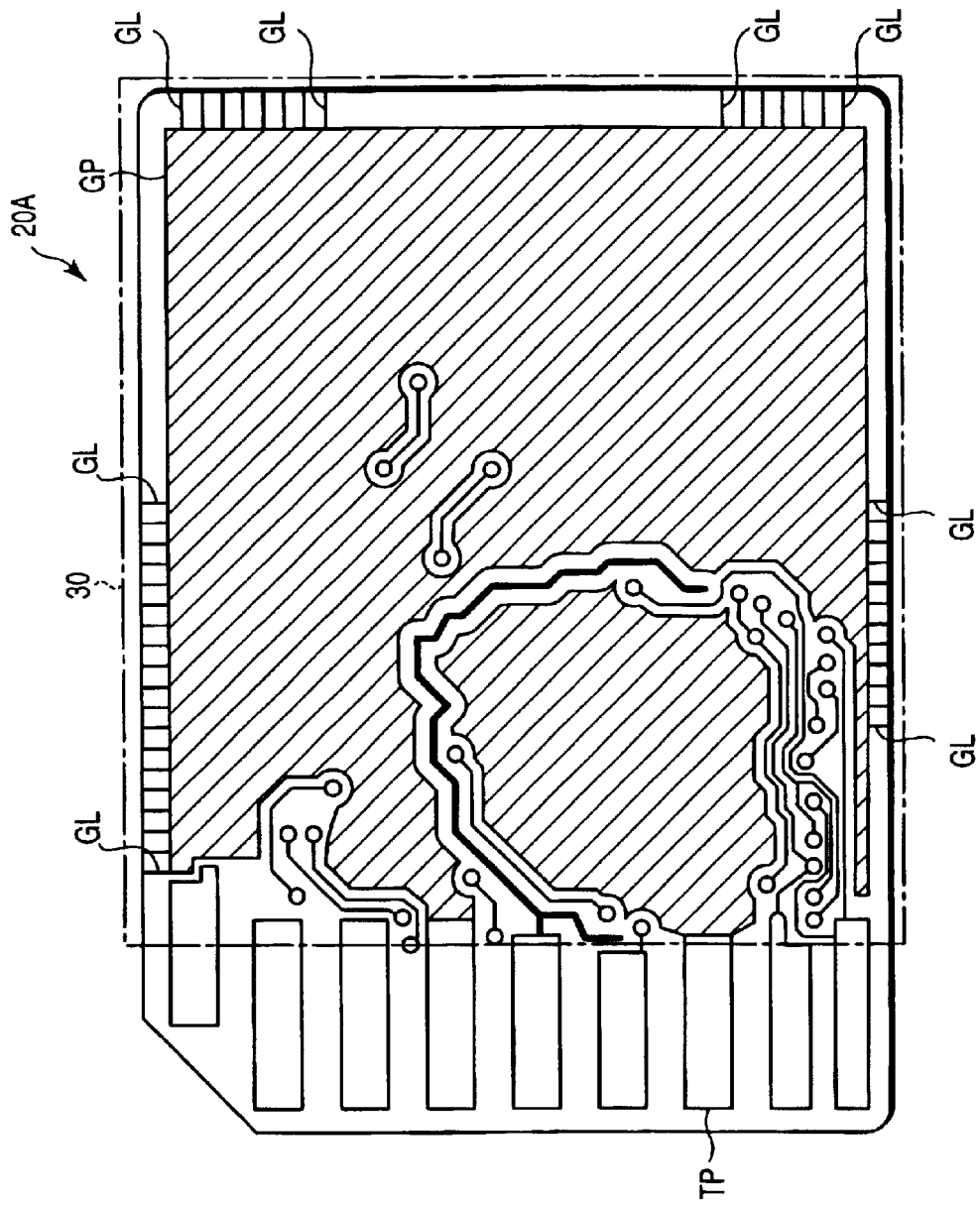
FIG. 3 is a diagram showing circuit patterns on a back surface of the circuit board according to the embodiment.

FIG. 3 shows the details of the back surface 20A of the circuit board 20. The back surface 20A is provided with a ground pattern GP forming a ground potential on the circuit. A plurality of charge prevention patterns GL, GL, . . . connected to the ground pattern GP and corresponding to the electrolytic plating patterns CP, CP, . . . are disposed so as to extend from edges of the circuit board 20. The charge prevention patterns GL, GL, . . . may be connected to a power supply pattern.

The charge prevention patterns GL, GL, . . . provided on the back surface 20A and the electrolytic plating patterns CP, CP, . . . disposed on the front surface 20B are disposed in a zigzag fashion (alternately) at predetermined intervals, as shown in FIG. 4, which is a sectional view of an end surface of the circuit board 20. The thickness Da of the coating layer 30 is smaller than the thickness Db of the card case 10.

In this manner, the charge prevention patterns GL, GL, . . . and the electrolytic plating patterns CP, CP, . . . are disposed in a zigzag pattern. Further, each of the electrolytic plating patterns CP, CP, . . . extends along the charge prevention patterns GL, GL, . . . so as to be sandwiched therebetween. Furthermore, the thickness Da of the coating layer 30 is smaller than the thickness Db of the card case 10. Consequently, when a user grips the grip portion 11, formed in the card case 10, shown in FIG. 1A, to insert or remove the electronic card into or from a computer, etc., a discharge current induced by static electricity flows into the ground pattern GP via the charge prevention patterns GL, GL, . . . , which are closest to the ground pattern GP. This avoids the disadvantage that a discharge current induced by static electricity flows into an internal circuit via the electrolytic plating patterns CP, CP, . . . .

As described above, this embodiment provides an electronic card formed of a double-sided printed circuit board and which has a simple and inexpensive configuration and for which more effective electrostatic measures are taken. In particular, effective electrostatic measures can be taken for the patterns formed at that edge of the circuit board which is located closer to the gripped portion.

That is, this embodiment provides an electronic card comprising a double-sided printed circuit board in which a surface thereof on which components are mounted is covered with a cover member, while the other surface thereof is coated with a protective film except for external connection terminals, wherein charge prevention circuit patterns connected to a ground pattern or a power supply pattern are provided on the other surface of the circuit board.

Further, this embodiment provides an electronic card formed of a double-sided printed circuit board with a grip portion, the electronic card comprising signal patterns provided on one surface of the circuit board, located under the grip portion, charge prevention patterns, provided on the other surface of the circuit board located under the grip portion, a cover member covering one surface of the circuit board, and a coating layer coating the circuit patterns disposed on the other surface of the circuit board, wherein the thickness of the coating layer is smaller than the thickness of the cover member.

Furthermore, this embodiment provides an electronic card formed of a double-sided circuit board, wherein with respect to circuit patterns provided on one surface of the circuit board and a plurality of electrolytic plating circuit patterns connected to the above circuit patterns and disposed so as to contact with edges of the circuit board, a plurality of charge prevention circuit patterns are disposed on the other surface of the circuit board so as to contact with edges thereof, the charge prevention circuit patterns being extended from a ground pattern or a power supply pattern along the electrolytic plating circuit patterns so as to sandwich each of the electrolytic plating circuit patterns therebetween.

Moreover, this embodiment provides an electronic card formed of a double-sided circuit board, one surface of which has circuit patterns forming signal paths, and electrolytic plating circuit patterns connected to the circuit patterns, disposed so as to contact the edges of the circuit board. The other surface has a ground pattern or a power supply pattern and charge prevention circuit patterns disposed to extend from the ground or power supply pattern along the electrolytic plating circuit patterns and contact the edges of the circuit board. A protective cover member covers one surface of the circuit board, and a protective film covers circuit patterns provided on at least a part of the other surface of the circuit board. The thickness of the protective film is smaller than the thickness of the protective cover.

Further, this embodiment provides an electronic card formed of a double-sided circuit board, and the electronic card comprises signal patterns disposed on one surface of the circuit board at the grip portion; charge prevention patterns disposed on the other surface of the circuit board at the grip portion; a protective cover covering one surface of the circuit board; and a protective film covering circuit patterns provided on at least a part of the other surface of the circuit board. The thickness of the protective film is smaller than the thickness of the protective cover.

The present invention is not limited to the above described embodiment. In the embodiment, the charge prevention patterns GL, GL, . . . are connected to the ground pattern to allow a discharge current induced by static electricity to flow to the ground (GND). However, the present invention is not limited to this connection, and, for example, the charge prevention patterns GL, GL, . . . may be connected to another power supply line with a low impedance, for example, a Vcc line (terminal) through which power is supplied to the interior of the card. Even if the charge prevention patterns GL, GL, . . . are connected to a power supply source (Vcc), a discharge current induced by static electricity can be converged and discharged on a low-impedance circuit of the power supply source. Consequently, stable circuit operations can be maintained without affecting the operation driving voltage or signal level of the internal circuit.

In the embodiment, charge prevention measures are taken for the charge prevention patterns CP, CP, . . . disposed up to the edges of the circuit board and connected to the patterns forming the signal paths for the internal circuit. However, the circuit patterns forming the signal paths may be protected from problems attributed to a discharge current induced by static electricity by disposing similar charge prevention patterns GL, GL, . . . for the circuit patterns disposed on the other surface 20B of the circuit board 20, which is located under the grip portion 11, the circuit patterns forming the signal paths.

In the embodiment, for simplification, one type of card structure and simple circuit patterns have been illustrated. However, the present invention is applicable to any kind of electronic card regardless of the card shape or structure.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An electronic card comprising:
   a printed circuit board which has components mounted on one surface thereof;
   a cover member which covers the one surface of the printed circuit board;
   external connection terminals provided on the other surface of the printed circuit board;
   a charge prevention pattern provided on the other surface of the printed circuit board; and
   a film which coats the other surface of the printed circuit board except for the external connection terminals, wherein a grip is formed at one end of the cover member, and the charge prevention pattern is provided under the grip.

2. An electronic card according to claim 1, wherein the charge prevention pattern is provided at a portion corresponding to a circuit pattern provided on the one surface of the printed circuit board.

3. An electronic card according to claim 2, wherein the charge prevention pattern and the circuit pattern are disposed in a zigzag fashion.

4. An electronic card comprising:
   a printed circuit board;
   a first circuit pattern disposed on one surface of the printed circuit board;
   a cover member which covers the one surface of the printed circuit board;
   a second circuit pattern disposed on the other surface of the printed circuit board;
   a charge prevention pattern which is disposed on the other surface of the printed circuit board; and
   a coating layer which coats the other surface of the printed circuit board, a thickness of the coating layer being smaller than a thickness of the cover member, wherein a grip is formed at one end of the cover member, and the charge prevention pattern is provided under the grip.

5. An electronic card according to claim 4, wherein the second circuit pattern comprises at least one of a ground pattern and a power supply pattern.

6. An electronic card according to claim 5, wherein the charge prevention pattern is provided at a portion corresponding to the second circuit pattern.

7. An electronic card according to claim 5, wherein the charge prevention pattern and the second circuit patterns are disposed in a zigzag fashion.

8. An electronic card comprising:
   a printed circuit board;
   a circuit pattern provided on one surface of the printed circuit board;
   a plating pattern provided at peripheries of the one surface of the printed circuit board and being connected to the circuit patterns so as to contact edges of the circuit board;
   a predetermined potential pattern provided on the other surface of the circuit board; and
   a charge prevention pattern provided at peripheries of the other surface of the circuit board and being connected to the predetermined potential pattern along the plating pattern so as to contact the edges of the circuit board.

9. An electronic card according to claim 8, wherein the plating pattern comprises first patterns, the charge prevention pattern comprises second patterns, and each of the first patterns are disposed between two of second patterns.

10. An electronic card according to claim 8, wherein the plating circuit pattern comprises first patterns, the charge prevention pattern comprises second patterns, and the first patterns and the second patterns are disposed in a zigzag fashion.

11. An electronic card comprising:
    a printed circuit board;
    a circuit pattern for a signal path and provided on one surface of the printed circuit board;
    a plating pattern provided at peripheries of the one surface of the printed circuit board and being connected to the circuit patterns so as to contact edges of the circuit board;
    a predetermined potential pattern provided on the other surface of the circuit board;
    a charge prevention pattern provided at peripheries of the other surface of the circuit board and being connected to the predetermined potential pattern along the plating pattern so as to contact the edges of the circuit board;
    a cover member which covers the one surface of the printed circuit board; and
    a film which coats the other surface of the printed circuit board.

12. An electronic card according to claim 11, wherein a thickness of the film is smaller than a thickness of the cover member.

13. An electronic card comprising:
    a printed circuit board which has components mounted on one surface thereof;
    a cover member which covers the one surface of the printed circuit board;
    external connection terminals provided at an end of the other surface of the printed circuit board;
    a charge prevention pattern provided at peripheries except the end providing the external connection terminals of the other surface of the circuit board so as to connect edges of the printed circuit board; and
    a film which coats the other surface of the printed circuit board except for the external connection terminals.

14. An electronic card according to claim 13, wherein a grip is formed at one end of the cover member, and the charge prevention pattern is provided under the grip.

15. An electronic card according to claim 14, wherein the charge prevention pattern is provided at a portion corresponding to a circuit pattern provided on the one surface of the printed circuit board.

16. An electronic card according to claim 15, wherein the charge prevention pattern and the circuit pattern are disposed in a zigzag fashion.

17. An electronic card comprising:
    a printed circuit board;
    a first circuit pattern disposed on one surface of the printed circuit board;
    a cover member which covers the one surface of the printed circuit board;

a second circuit pattern disposed on the other surface of the printed circuit board;

a charge prevention pattern which is disposed at peripheries of the other surface of the printed circuit board so as to connect edges of the printed circuit board; and a coating layer which coats the other surface of the printed circuit board, a thickness of the coating layer being smaller than a thickness of the cover member.

18. An electronic card according to claim 17, wherein the second circuit pattern comprises at least one of a ground pattern and a power supply pattern.

19. An electronic card according to claim 18, wherein a grip is formed at one end of the cover member, and the charge prevention pattern is provided under the grip.

20. An electronic card according to claim 18, wherein the charge prevention pattern is provided at a portion corresponding to the second circuit pattern.

21. An electronic card according to claim 18, wherein the charge prevention pattern and the second circuit pattern are disposed in a zigzag fashion.

* * * * *